United States Patent [19]

Haver et al.

[11] Patent Number: 5,512,785
[45] Date of Patent: Apr. 30, 1996

[54] SEMICONDUCTER DEVICE HAVING AN EMITTER TERMINAL SEPARATED FROM A BASE TERMINAL BY A COMPOSITE NITRIDE/OXIDE LAYER

[75] Inventors: Harrison B. Haver, Scottsdale; Mark D. Griswold, Chandler, both of Ariz.

[73] Assignee: Motorola, Inc., Schaumburg, Ill.

[21] Appl. No.: 347,522

[22] Filed: Nov. 30, 1994

[51] Int. Cl.[6] .................................................. H01L 23/58
[52] U.S. Cl. ...................... 257/758; 257/760; 257/587; 257/639; 257/640; 257/649; 257/588
[58] Field of Search .................................... 257/760, 758, 257/587, 588, 635, 639, 640, 649

[56] References Cited

U.S. PATENT DOCUMENTS

| | | | |
|---|---|---|---|
| 5,101,256 | 3/1992 | Harame et al. | 257/588 |
| 5,109,262 | 4/1992 | Kadota et al. | 257/587 |
| 5,137,840 | 8/1992 | Desilets et al. | 257/588 |
| 5,235,206 | 8/1993 | Desilets et al. | 257/588 |
| 5,345,102 | 9/1994 | Matsumoto | 257/586 |
| 5,391,905 | 2/1995 | Yamazaki | 257/588 |
| 5,397,912 | 3/1995 | Sundaram | 257/588 |

*Primary Examiner*—Rolf Hille
*Assistant Examiner*—David B. Hardy
*Attorney, Agent, or Firm*—Bruce T. Neel

[57] ABSTRACT

A semiconductor device (8) has an insulating layer (16) overlying a semiconductor substrate (12). The insulating layer has a first opening that defines an aperture (18) extending from the insulating layer to the semiconductor substrate, and at least a first portion of a first conductive terminal (42) is disposed in the aperture. A second conductive terminal (52) has a second portion (28) disposed in the aperture. The second portion of the second conductive terminal is separated from the first conductive terminal by a composite dielectric layer including a nitride layer (32) and an oxide layer (30). In one approach, the oxide layer is formed by the oxidation of the second portion of the second conductive terminal.

2 Claims, 4 Drawing Sheets

SEMICONDUCTER DEVICE HAVING AN EMITTER TERMINAL SEPARATED FROM A BASE TERMINAL BY A COMPOSITE NITRIDE/OXIDE LAYER

BACKGROUND OF THE INVENTION

The present invention relates, in general, to semiconductor devices and, more particularly, to a composite dielectric layer for electrically insulating two conductive terminals of a semiconductor device.

A typical bipolar semiconductor device is formed on a silicon substrate such as, for example, a lightly-doped epitaxial layer, and includes an emitter terminal and a base terminal that each contact diffusion regions in the substrate. One material typically used for forming these terminals is polysilicon, and the terminals usually have metal contacts formed on their top surface. The emitter terminal is typically formed through an opening in an insulating layer overlying the substrate and is separated from the base terminal by a thin dielectric layer.

One prior dielectric material used to electrically separate the emitter and base terminals is silicon nitride. However, the use of silicon nitride causes several adverse effects in the operation of the bipolar device. One significant adverse effect is an excessive leakage current between the emitter and base terminals. The leakage current may flow by numerous leakage paths, such as through a nitride defect, and significantly degrades device performance, quality, and reliability. Another adverse effect of a silicon nitride dielectric is the formation of stress cracks due to the high mechanical stress of the deposited silicon nitride layer.

Accordingly, it is desirable to have a dielectric layer for separating the emitter and base terminals of a bipolar device that reduces emitter-base leakage and stress cracks in the dielectric layer.

DETAILED DESCRIPTION OF THE DRAWINGS

Briefly stated, the present invention provides a semiconductor device having an insulating layer overlying a semiconductor substrate. The insulating layer has a first opening that defines an aperture extending from the insulating layer to the semiconductor substrate, and at least a first portion of a first conductive terminal is disposed in the aperture. A second conductive terminal has a second portion disposed in the aperture. The second portion of the second conductive terminal is separated from the first conductive terminal by a composite dielectric layer comprising a nitride layer and an oxide layer. In one approach according to the present invention, the oxide layer is formed by the oxidation of the second portion of the second conductive terminal.

The present invention can be more fully described with reference to FIGS. 1–10, which illustrate the stages in the formation of a composite dielectric layer in a bipolar semiconductor device 8 (see FIG. 10) according to a preferred embodiment of the present invention. Common reference numbers are used throughout FIGS. 1–10 when referring to common elements.

Figure 1:
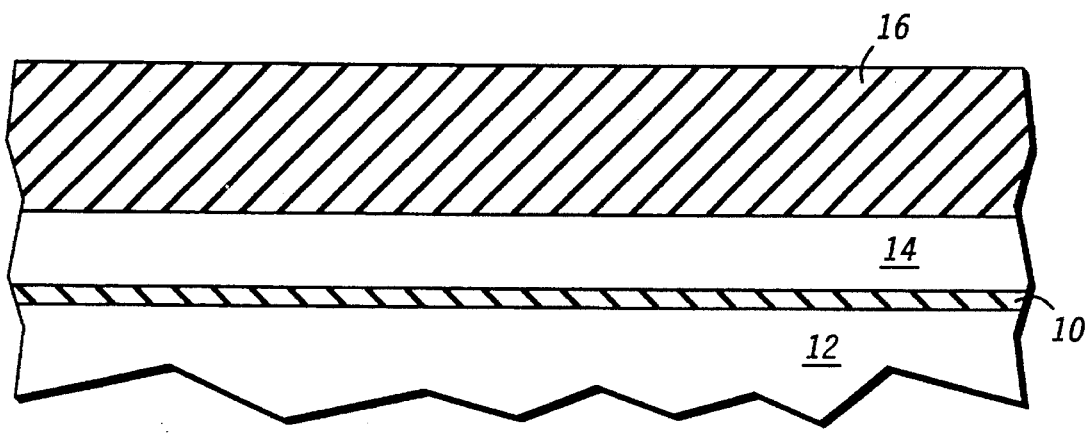
FIGS. 1–10 are cross-sectional views showing the formation of a composite dielectric layer in a bipolar semiconductor device according to a preferred embodiment of the present invention.

FIG. 1 illustrates a cross-sectional view of bipolar semiconductor device 8 (see FIG. 10) in an early stage of manufacture. A pad oxide layer 10, which is preferably silicon oxide, has been formed on a semiconductor substrate 12, which is preferably silicon. Pad oxide layer 10 is formed, for example, by placing substrate 12 in a steam ambient at about 900° C. until pad oxide layer 10 has a thickness of about 300–600 angstroms. A conducting layer 14 has been formed on pad oxide layer 10. Conducting layer 14 is preferably polycrystalline silicon (also referred to herein as polysilicon) and can be, for example, deposited using conventional low-pressure chemical vapor deposition (LPCVD) techniques to a thickness of about 1,000–3,000 angstroms. Conducting layer 14 is, for example, doped with boron if an npn device is to be formed. An insulating layer 16 has been formed on conducting layer 14. Insulating layer 16 is preferably an insulation glass layer of silicon oxide and is formed using conventional techniques, such as chemical vapor deposition, to a thickness of about, for example, 2,000–4,000 angstroms.

Figure 2:
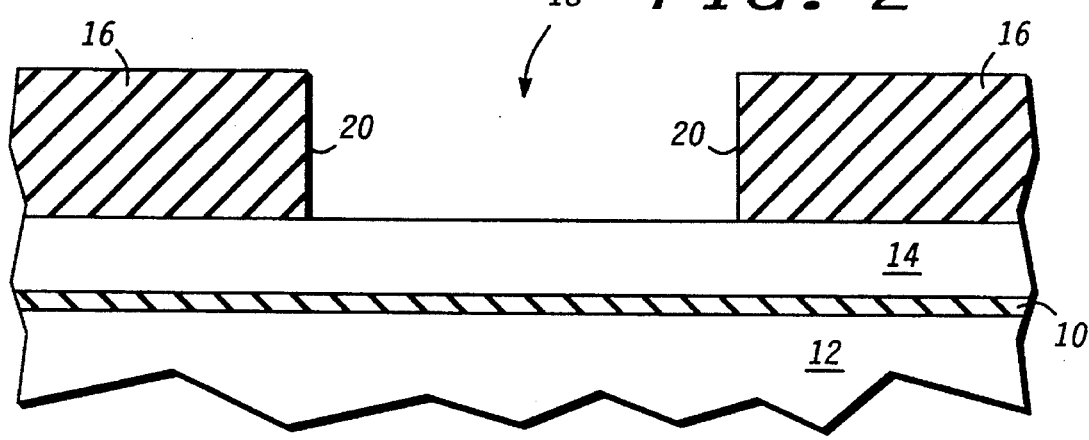

In FIG. 2, an opening for an aperture 18 is formed in insulating layer 16 by, for example, patterning a photoresist layer (not shown) using conventional photolithography and etching the opening using, for example, conventional reactive ion etching (RIE). This etching provides substantially vertical sidewalls 20 and exposes conducting layer 14. After etching, the photoresist layer is removed using conventional means such as an oxygen plasma cleaning. Following further processing which is described below, aperture 18 will substantially extend through conducting layer 14 and pad oxide layer 10 to the surface of substrate 12.

Figure 3:
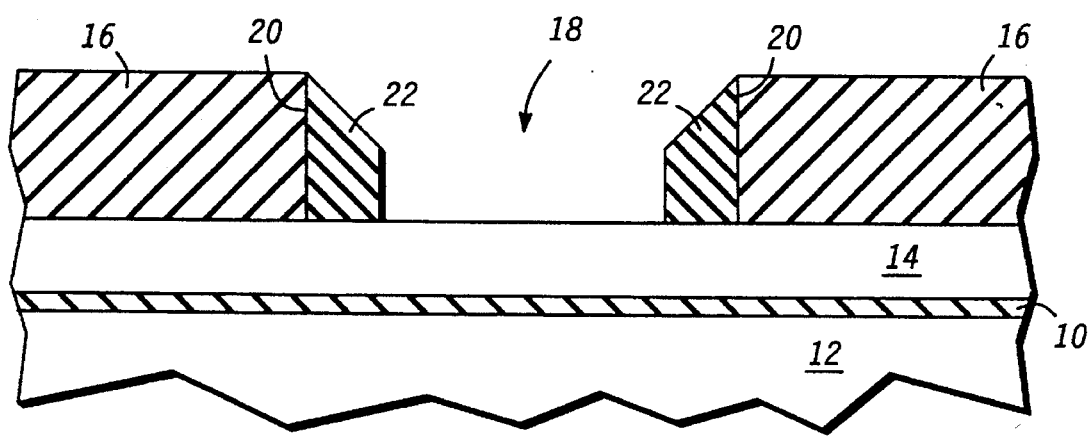

Referring to FIG. 3, spacers 22, which are preferably silicon nitride, are formed as follows. A silicon nitride layer (not shown) is formed using conventional LPCVD as a blanket layer over the exposed surfaces of insulating layer 16 and conducting layer 14 to a thickness of, for example, about 500–2,000 angstroms. Next, this silicon nitride layer is etched back using a conventional anisotropic etch such as, for example, RIE. This etch substantially removes those portions of the silicon nitride layer on the top surfaces of insulating layer 16 and conducting layer 14, and the portions of the silicon nitride layer remaining on sidewalls 20 provide spacers 22.

Figure 4:
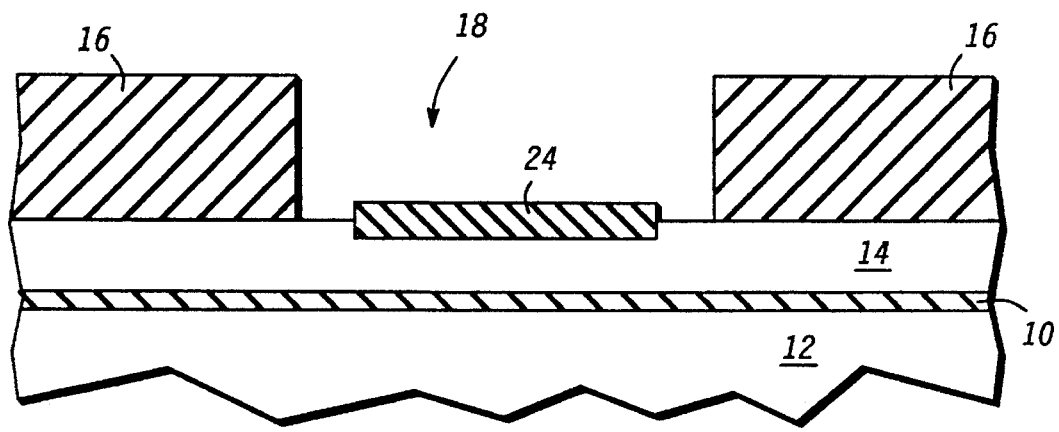

In FIG. 4, an oxide layer 24, which is preferably silicon oxide, has been formed by placing the exposed surface of conducting layer 14, which is the surface not covered by spacers 22 (see FIG. 3) or insulating layer 16, in an oxidizing ambient such as, for example, steam at about 900° C. Oxide layer 24 has a final thickness of, for example, about 200–1,000 angstroms. After forming oxide layer 24, spacers 22 are removed, for example, with an appropriate wet or dry etch solution such as hot phosphoric acid. The portions of conducting layer 14 that were previously covered by spacers 22 are now exposed.

Figure 5:
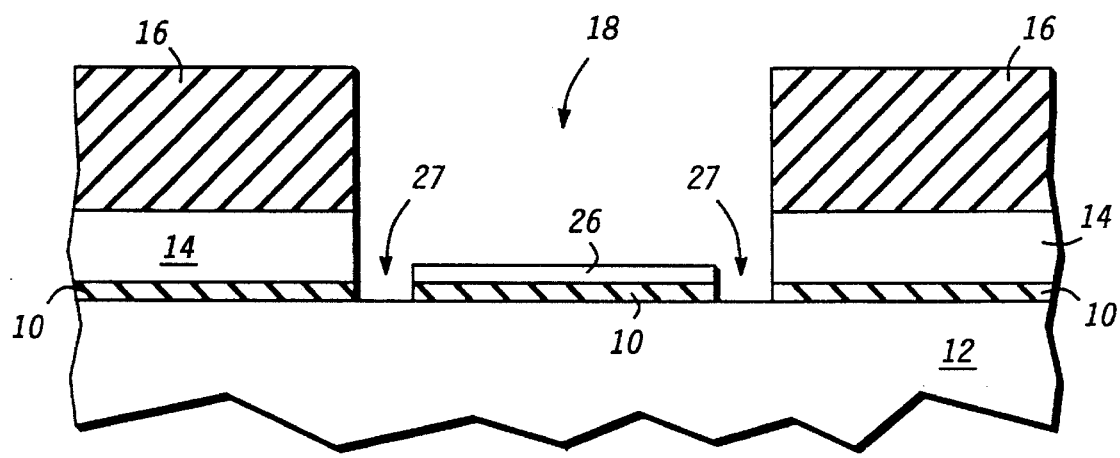

As seen in FIG. 5, openings 27 for base diffusion region contacts, which are provided later in the process to contact substrate 12, are formed by a sequence of appropriate anisotropic etches as in the following example: First, an RIE is performed with an etchant that chemically attacks polysilicon with oxide layer 24 and insulating layer 16 acting as etch-resistant masks. Following this etch, polysilicon conducting layer 14 is removed vertically down to pad oxide layer 10, which is also resistant to this RIE and acts as an etch stop.

Second, an RIE is performed with an etchant that chemically attacks silicon oxide to remove oxide layer 24. After the removal of oxide layer 24, the RIE continues with a polysilicon layer 26 acting as an etch mask. Polysilicon layer 26 is that portion of conducting layer 14 that was previously underneath oxide layer 24 and that is now exposed by the removal of oxide layer 24 during this etch. The RIE is continued to remove those portions of pad oxide layer 10 not covered by polysilicon layer 26. Substrate 12 acts as an etch stop for this etch. The RIE is complete when substrate 12 has been exposed to provide openings 27. The thickness of polysilicon layer 26 following the two etchings above is not critical.

Figure 6:
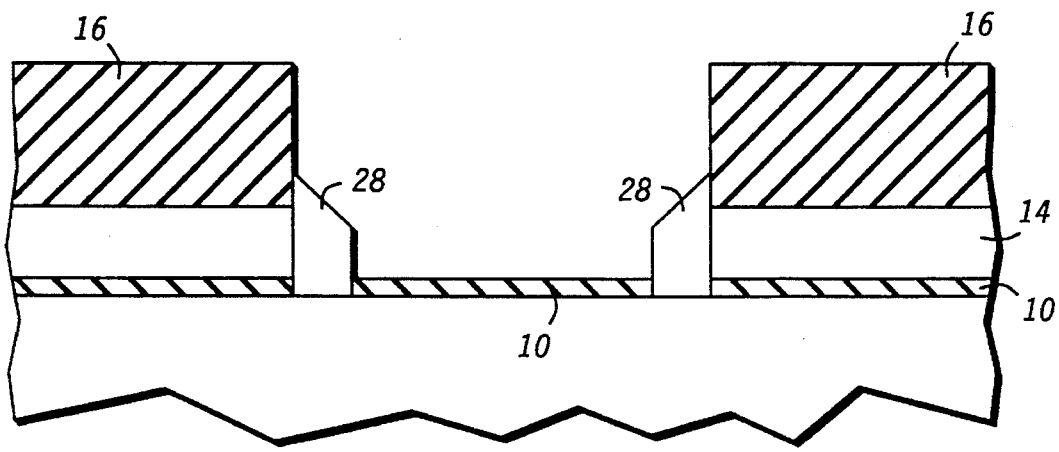

In FIG. 6, base contact plugs 28 are formed as follows. A blanket polysilicon layer (not shown) is deposited by a conventional approach over the exposed surfaces of insulating layer 16, substrate 12, and polysilicon layer 26 (see FIG. 5). Next, the blanket polysilicon layer is etched back using, for example, a conventional RIE etchant to remove substantially all portions of the blanket polysilicon layer except for plugs 28. Polysilicon layer 26 is substantially removed during this etch-back.

Figure 7:
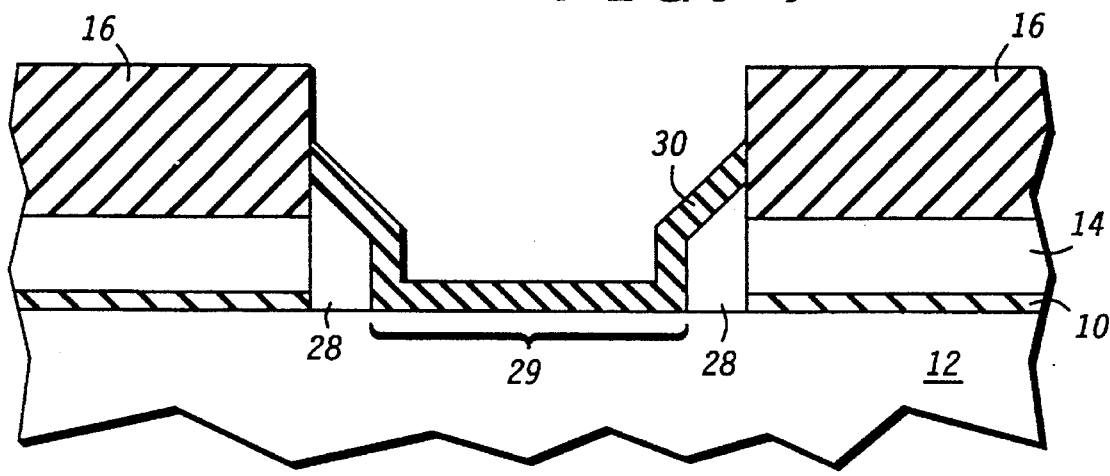

In FIG. 7, according to the present invention, an oxide layer 30 is formed on plugs 28 and substrate 12. Oxide layer 30 is preferably silicon oxide, which may be grown, for example, in a conventional furnace at an elevated temperature of about 800°–1,000° C. in a wet or dry oxidizing ambient. The preferred thickness of oxide layer 30 is about 100–1,000 angstroms, and this thickness substantially corresponds to that portion of oxide layer 30 overlying plugs 28. As one specific example, oxide layer 30 is grown at a temperature of about 900° C. in a substantially pure oxygen ambient to a thickness (as measured over plugs 28) of about 450 angstroms.

Oxide layer 30 is formed in part by the oxidation of the exposed surfaces of plugs 28. Also, the portion of original pad oxide layer 10 disposed between plugs 28 (see FIG. 6) is increased in thickness during the oxidation of plugs 28 (due to localized re-oxidation of substrate 12) to substantially provide the extent of oxide layer 30 which is directly in contact with substrate 12. It should be noted that plugs 28 become conductive as a result of out-diffusion of dopant from conducting layer 14 during this oxidation. Plugs 28 provide an electrical connection between conducting layer 14 and substrate 12.

As an alternative to the above, oxide layer 30 may be formed using other methods such as conventional deposition. Also, oxide layer 30 can instead be an silicon oxynitride layer, which may also be formed, for example, by conventional chemical vapor deposition.

Following the oxidation of base contact plugs 28, an intrinsic base implant is performed. For example, if an npn-type bipolar device is being formed, then a blanket boron ion implant of about 2E13 atoms/cm$^2$ at 25 keV is performed. Substrate 12 has boron atoms implanted primarily in a region 29 underneath the portion of oxide layer 30 between plugs 28. This implant also further dopes plugs 28.

Figure 8:
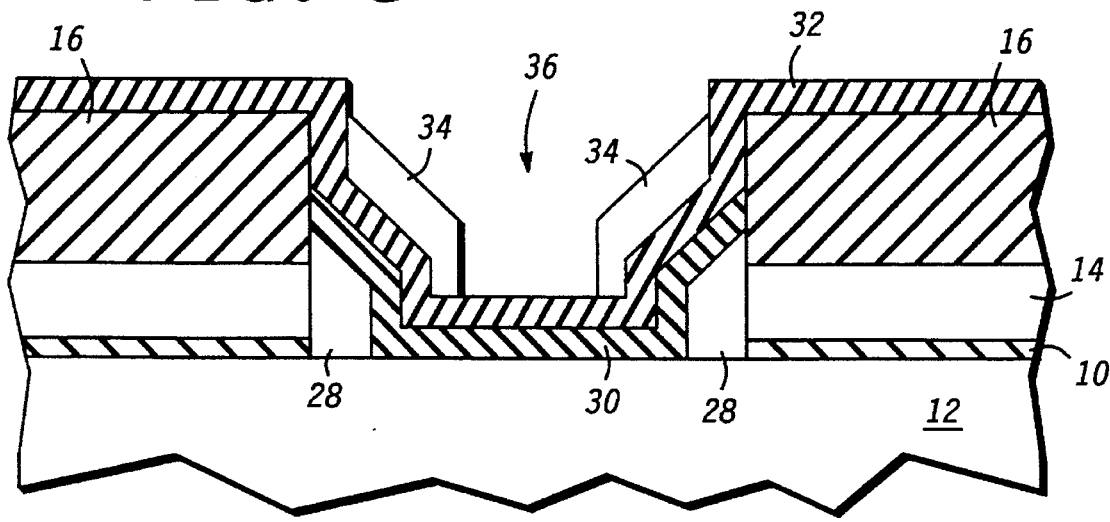

With reference to FIG. 8, a nitride layer 32, which is preferably a silicon nitride layer, is formed over insulating layer 16 and oxide layer 30 using, for example, conventional LPCVD to have a thickness of about 500–2,000 angstroms. Next, a blanket polysilicon layer (not shown) is formed, for example by deposition, over nitride layer 32 to have a thickness of about 1,000–4,000 angstroms. The polysilicon layer is then etched back using an anisotropic etch such as RIE to provide spacers 34. Nitride layer 32 acts as an etch-resistant layer during this etch-back. Following this etch, an opening 36 is provided between spacers 34. It should be appreciated that this etch substantially removes the polysilicon disposed on the horizontal portions of the blanket polysilicon layer, and the degree of etch-back used corresponds to the size of an emitter opening 40 (see FIG. 9) to be formed later.

Figure 9:
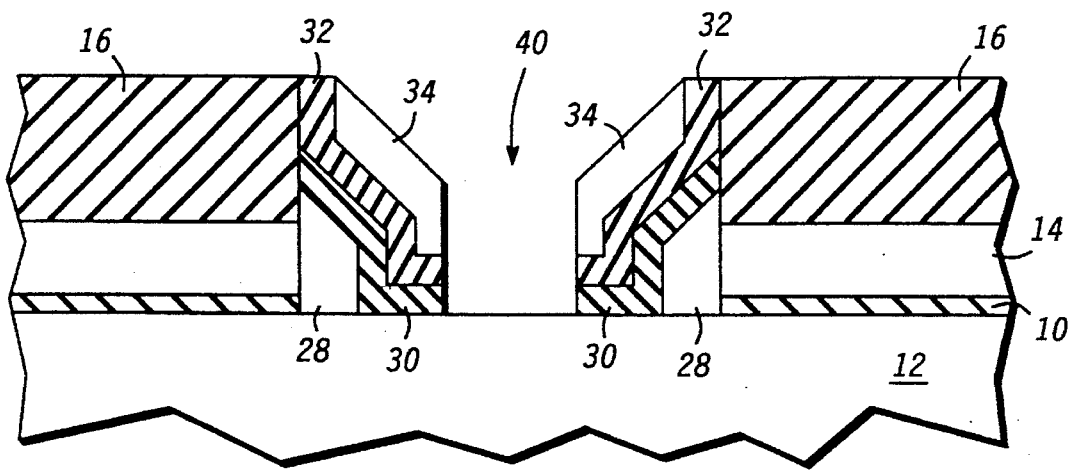

As seen in FIG. 9, emitter opening 40, which exposes a portion of the surface of substrate 12, is formed. This is accomplished by first etching the portion of nitride layer 32 exposed by opening 36 (see FIG. 8) using a suitable dry or wet etchant such as hot phosphoric acid. Then, the portion of oxide layer 30 within opening 36 (see FIG. 8), which is exposed by the etching of nitride layer 32, is etched using a suitable wet etchant such as dilute hydroflouric acid to provide emitter opening 40.

Figure 10:
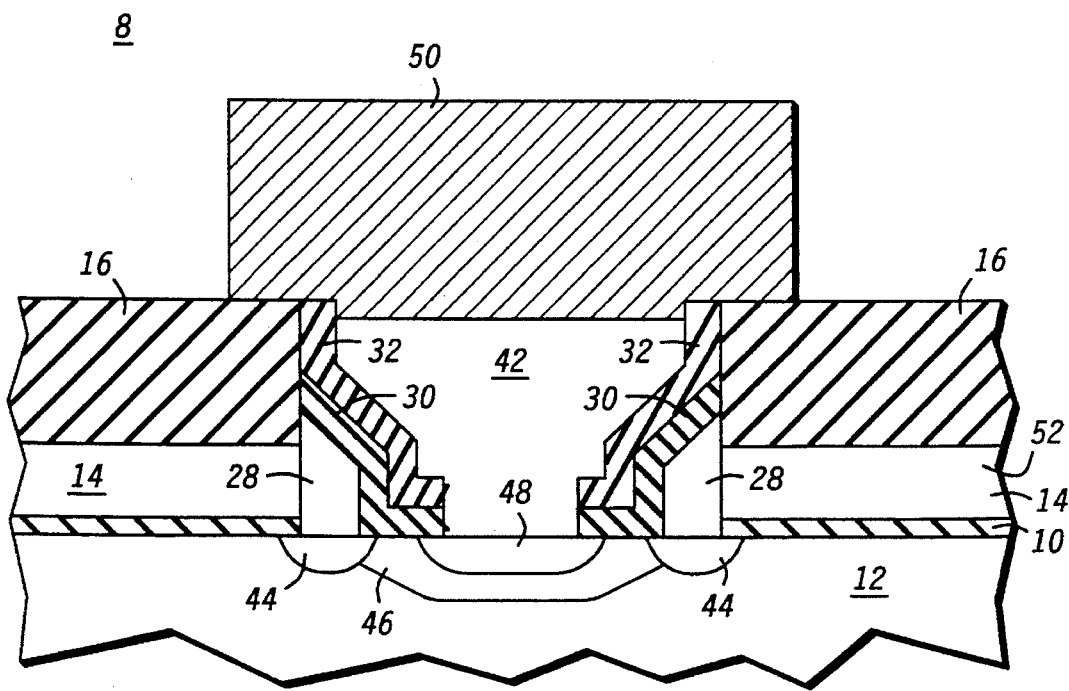

Fully-fabricated bipolar semiconductor device 8 is shown in FIG. 10. When device 8 is an npn-type transistor, substrate 12 is, for example, a lightly-doped n-type epitaxial layer formed on a heavily-doped n-type buried layer (not shown) that acts as a collector for device 8. The buried layer is, for example, formed on a heavily-doped p-type semiconductor supporting substrate (not shown). However, one of skill in the art will recognize that in other embodiments substrate 12 may be a semiconductor wafer without an epitaxial layer.

A first conductive terminal 42 is formed in emitter opening 40 (see FIG. 9) by, for example, LPCVD of a polysilicon layer to a thickness of about 6,000–10,000 angstroms. Spacers 34 (see FIG. 9) are not removed, but instead become a part of this new polysilicon layer. The polysilicon layer is then etched back by, for example, RIE so that the polysilicon layer substantially only remains in emitter opening 40 in order to provide first conductive terminal 42. First conductive terminal 42 acts as an emitter terminal and is doped with, for example, arsenic, when device 8 is an npn-type transistor. A second conductive terminal 52, which acts as a base terminal for device 8, is provided by plugs 28 and conducting layer 14. Second conductive terminal is connected to a metal base contact (not shown).

Next, substrate 12 is subjected to a high temperature diffusion activation step such as, for example, rapid thermal annealing, to form an extrinsic base diffusion region 44, an intrinsic base diffusion region 46, and an emitter diffusion region 48. An example of a suitable rapid thermal anneal is heating at about 1,050° C. for about 40 seconds. Emitter diffusion region 48 is formed by diffusion from polysilicon first conductive terminal 42, intrinsic base diffusion region 46 is formed by diffusion from the intrinsic base implant in region 29 (see FIG. 6), and extrinsic base diffusion region 44 is formed by diffusion from plugs 28. Then, a metal contact 50 is formed on first conductive terminal 42 using, for example, aluminum.

In FIG. 10, according to the present invention, nitride layer 32 and oxide layer 30 together provide a composite dielectric layer for semiconductor device 8 that electrically isolates first conductive terminal 42 from second conductive terminal 52. Although nitride layer 32 is described here as being formed overlying oxide layer 30, one of skill in the art will recognize that in other devices a composite dielectric layer can be formed having an oxide layer overlying a nitride layer. Also, the composite dielectric layer can include other dielectric layers in addition to nitride layer 32 and oxide layer 30.

One advantage of the composite dielectric layer of the present invention is that emitter-base leakage is substantially reduced in bipolar semiconductor device 8, for both npn and pnp-type devices. Also, it has been found that the additional step of oxidizing plugs 28 to form oxide layer 30 results in improved reverse-bias hot carrier injection resistance for npn-type devices. In addition, semiconductor device 8 has a reduced sensitivity to ultra-violet light, which causes an adverse memory effect in prior devices.

Other advantages include a reduction in the mechanical stress of the composite dielectric layer and additional protection against plasma discharge dielectric damage relative to prior thin silicon nitride dielectrics. Further, stress-induced damage of the monocrystalline surface of substrate 12, as observed in stress transfer from prior thin silicon nitride dielectrics, is substantially reduced. In addition, oxide layer 30 protects plugs 28 from micro-crevice formation between nitride layer 32 and insulating layer 16. The oxidation of plugs 28 fully surrounds plugs 28 and protects them from any adverse metal migration from metal contact 50 down through a micro-crevice.

By now, it should be appreciated that there has been provided a novel composite dielectric layer and method for insulating two conductive terminals of a semiconductor device. The composite dielectric layer substantially reduces emitter-base leakage and the stress cracks observed with prior thin dielectric layers which used only a nitride layer.

We claim:

1. A semiconductor device comprising:

a pad oxide layer disposed on a semiconductor substrate;

a conducting layer disposed on said pad oxide layer;

an insulating layer disposed on said conducting layer wherein said insulating layer has a first opening, said conducting layer has a second opening, and said pad oxide layer has a third opening, wherein said first, second, and third openings are substantially coextensive and define an aperture that extends from said insulating layer to said semiconductor substrate;

a conductive plug disposed in said aperture and in contact with both said conducting layer and a first diffusion region in said semiconductor substrate;

an oxide layer disposed in said aperture and on said conductive plug wherein said oxide layer is also in contact with said semiconductor substrate;

a nitride layer disposed on said oxide layer; and a first conductive terminal substantially disposed in said aperture and in contact with a second diffusion region in said semiconductor substrate wherein said oxide layer and said nitride layer are disposed between said first conductive terminal and said conductive plug.

2. The device of claim 1 wherein:

said semiconductor substrate is silicon;

said conducting layer is polysilicon;

said oxide layer is silicon oxide; and said nitride layer is silicon nitride.

* * * * *